United States Patent
Paton et al.

(10) Patent No.: US 6,703,277 B1
(45) Date of Patent: Mar. 9, 2004

(54) REDUCING AGENT FOR HIGH-K GATE DIELECTRIC PARASITIC INTERFACIAL LAYER

(75) Inventors: Eric N. Paton, Morgan Hill, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/118,437

(22) Filed: Apr. 8, 2002

(51) Int. Cl.⁷ .......................................... H01L 21/8242
(52) U.S. Cl. ......................... 438/287; 438/3; 438/240; 438/528; 438/558; 438/591
(58) Field of Search ......................... 438/287, 240, 438/3, 261, 591, 558, 528, 530

(56) References Cited

U.S. PATENT DOCUMENTS

| | | | |
|---|---|---|---|
| 5,909,043 A | 6/1999 | Summerfelt | 257/298 |
| 6,140,167 A * | 10/2000 | Gardner et al. | 438/287 |
| 6,184,072 B1 | 2/2001 | Kaushik et al. | 438/197 |
| 6,300,203 B1 | 10/2001 | Buynoski et al. | 438/287 |
| 6,319,730 B1 * | 11/2001 | Ramdani et al. | 438/240 |
| 6,451,641 B1 * | 9/2002 | Halliyal et al. | 438/287 |
| 6,573,197 B2 * | 6/2003 | Callegari et al. | 438/791 |
| 6,579,767 B2 * | 6/2003 | Park et al. | 438/287 |

* cited by examiner

*Primary Examiner*—Michael Trinh
(74) *Attorney, Agent, or Firm*—Renner, Otto, Boisselle & Sklar, LLP

(57) ABSTRACT

A semiconductor device and a process for fabricating the device, the process including steps of depositing on the silicon substrate a layer comprising at least one high-K dielectric material, whereby a quantity of silicon dioxide is formed at an interface between the silicon substrate and the high-K dielectric material layer; depositing on the high-K dielectric material layer a layer of a metal; and diffusing the metal through the high-K dielectric material layer, whereby the metal reduces at least a portion of the silicon dioxide to silicon and the metal is oxidized to form a dielectric material having a K value greater than silicon dioxide. In another embodiment, the metal is implanted into the interfacial layer. A semiconductor device including such metal layer and implanted metal is also provided.

20 Claims, 5 Drawing Sheets

REDUCING AGENT FOR HIGH-K GATE DIELECTRIC PARASITIC INTERFACIAL LAYER

TECHNICAL FIELD

The invention relates generally to the fabrication of semiconductor devices and, more particularly, to the fabrication of an interfacial barrier layer in devices with a high-K gate dielectric material layer.

BACKGROUND ART

Fabrication of a semiconductor device and an integrated circuit including the same begins with a semiconductor substrate and employs film formation, ion implantation, photolithographic, etching and deposition techniques to form various structural features in or on the semiconductor substrate to attain individual circuit components which are then interconnected to form ultimately an integrated circuit. Escalating requirements for high densification and performance associated with ultra large-scale integration (ULSI) circuits requires smaller design features, increased transistor and circuit speeds, high reliability and increased manufacturing throughput for competitiveness. As the devices and features shrink, and as the drive for higher performing devices escalates, new problems are discovered that require new methods of fabrication or new arrangements or both.

There is a demand for large-scale and ultra large-scale integrated circuits employing high performance metal-oxide-semiconductor (MOS) devices. MOS devices typically comprise a pair of ion implanted source/drain regions in a semiconductor substrate and a channel region separating the source/drain regions. Above the channel region is typically a thin gate dielectric material, usually referred to as a gate oxide, and a conductive gate comprising conductive polysilicon or another conductive material. In a typical integrated circuit, a plurality of MOS devices of different conductivity types, such as n-type and p-type, and complementary MOS (CMOS) devices employing both p-type and n-type devices are formed on a common substrate. MOS technology offers advantages of significantly reduced power density and dissipation as well as reliability, circuit performance and cost advantages.

The drive towards increased miniaturization and the resultant limits of conventional gate oxide layers have served as an impetus for the development of newer, high dielectric constant ("high-K") materials as substitutes for conventional silicon dioxide-based gate oxide layers. Since the drain current in a MOS device is inversely proportional to the gate oxide thickness, the gate oxide is typically made as thin as possible commensurate with the material's breakdown potential and reliability.

Decreasing the thickness of the gate oxide layer between the gate electrode and the source/drain extension regions together with the relatively high electric field across the gate oxide layer, can undesirably cause charge carriers to tunnel across the gate oxide layer. This renders the transistor "leaky", degrading its performance. To alleviate this problem, high-k dielectric materials are used as the gate insulator. Herein, a high-K gate oxide may be referred to as a high-K gate dielectric material layer, in order to emphasize that the gate dielectric comprises a high-K dielectric material rather than silicon dioxide.

One problem which has been encountered in integrating high-K dielectric materials into semiconductor devices, including devices such as EEPROMs and other flash memory devices, is the undesirable interaction between many high-K dielectric materials and the silicon used in other semiconductor device structures. Of particular concern herein is the interaction between the high-K dielectric material used for the high-K gate dielectric material and the silicon, polysilicon or polysilicon-germanium substrate upon which the high-K dielectric material is deposited. The undesirable interactions occur as a result of the high-K dielectric materials being deposited on these substrates.

One particular undesirable interaction which may occur is the oxidation of the silicon or polysilicon material in contact with a high-K gate dielectric material layer by oxygen used in forming the high-K dielectric material layer, and by the oxygen in the metal oxides of which most high-K dielectric materials are formed.

Hence, it would be highly advantageous to develop a process that would permit the use of optimum materials in the formation of a high-K gate dielectric material, without the problems which result from oxidation of silicon, polysilicon or polysilicon-germanium upon which the high-K dielectric material is deposited. Accordingly, there exists a need for a process of manufacturing semiconductor devices with a high-K dielectric material layer that improves device performance, while avoiding undesirable interactions between elements, such as the oxidation of silicon substrates or polysilicon gate electrodes by the high-K gate dielectric materials deposited thereon. In particular, a need remains for a process of forming a high-K dielectric material over a silicon, polysilicon or polysilicon-germanium substrate while avoiding or reversing the effects of oxidation of the substrate at the interface between the silicon, polysilicon or polysilicon-germanium substrate and the high-K dielectric material.

DISCLOSURE OF INVENTION

In one embodiment, the present invention relates to a process for fabricating a semiconductor device having a high-K dielectric layer over a silicon substrate, comprising depositing on the silicon substrate a layer comprising at least one high-K dielectric material, whereby a quantity of silicon dioxide is formed at an interface between the silicon substrate and the high-K dielectric material layer; depositing on the high-K dielectric material layer a layer of a metal; and diffusing the metal through the high-K dielectric material layer, whereby the metal reduces at least a portion of the silicon dioxide to silicon and the metal is oxidized to form a dielectric material having a K value greater than silicon dioxide.

In another embodiment, the present invention relates to a process for fabricating a semiconductor device having a high-K dielectric layer over a silicon substrate, including steps of depositing on the silicon substrate a layer comprising at least one high-K dielectric material, whereby a quantity of silicon dioxide is formed at an interface between the silicon substrate and the high-K dielectric material layer; implanting a metal to a vicinity of the silicon dioxide; and subjecting the metal to conditions whereby the metal reduces at least a portion of the silicon dioxide to silicon and the metal is oxidized to form a dielectric material having a K value greater than silicon dioxide.

In another embodiment, the present invention relates to a semiconductor device, including a silicon substrate; on the silicon substrate a layer of a high-K dielectric material; a quantity of silicon dioxide at an interface between the silicon substrate and the high-K dielectric material layer; and a layer of metal deposited on the high-K dielectric material layer, in which the metal is capable of reacting with at least a portion of the silicon dioxide to form a metal oxide having a K value greater than silicon dioxide.

In another embodiment, the present invention relates to a semiconductor device, including a silicon substrate; on the silicon substrate a layer of a high-K dielectric material; a quantity of silicon dioxide at an interface between the silicon substrate and the high-K dielectric material layer; and a metal implanted or diffused through the high-K dielectric material layer to the interface, in which the metal is capable of reacting with at least a portion of the silicon dioxide to form a metal oxide having a K value greater than silicon dioxide.

In one embodiment, the metal preferentially forms an oxide or a silicate rather than a silicide. In one embodiment, the Gibbs free energy of the metal oxide is more negative than the Gibbs free energy of silicon dioxide. In one embodiment, the Gibbs free energy of the metal oxide is more negative than the Gibbs free energy of the metal silicide.

Thus, the present invention provides a solution to the problem of forming a high-K dielectric material layer on a silicon substrate or of forming a polysilicon or polysilicon-germanium gate electrode on a high-K dielectric material layer, while avoiding or reversing resulting oxidation of the silicon or polysilicon.

Figure 1:
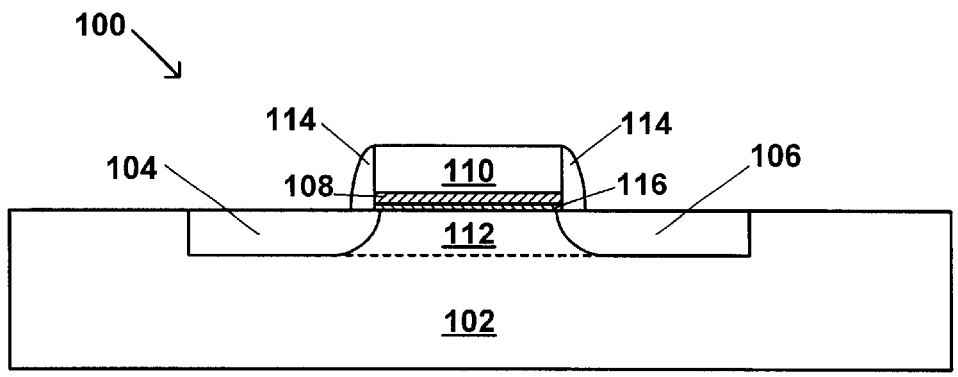
FIG. 1 is a schematic cross-sectional view of an exemplary MOS structure, in accordance with an embodiment of the present invention.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

MODES FOR CARRYING OUT THE INVENTION

As used herein, the term "standard-K dielectric material" refers to a dielectric material having a dielectric constant, referred to herein simply as "K" or "K value", up to about 10. Such standard-K dielectric materials include, for example, silicon dioxide, which has a K of about 4, silicon oxynitride, which has a K of about 4–8 depending on the relative content of oxygen and nitrogen, silicon nitride, which has a K of about 6–9, and aluminum oxide, which has a K of about 10.

As used herein, the term "high-K dielectric material" refers to a dielectric material having a K greater than about 10. Such high-K dielectric materials include, for example, $HfO_2$, $ZrO_2$ and others known in the art, some of which are specifically identified more fully below. In general, the term "high-K dielectric material" encompasses binary, ternary and higher dielectric oxides and any ferroelectric material having a K of about 10 or more. High-K dielectric materials may also include, for example, composite dielectric materials such as hafnium silicate, which has a K of about 14, a and hafnium silicon nitride, which has a K of about 18.

As used herein, the term "composite dielectric material" refers to a dielectric material comprising the elements of at least two other dielectric materials. A composite dielectric material generally has a K value as defined above for a high-K dielectric material, i.e., a K value greater than about 10. In one embodiment, a composite dielectric material is formed by co-deposition of its component elements. In another embodiment, the composite dielectric material is formed by sequential deposition of the component dielectric materials followed by a treatment step, e.g., thermal treatment, to combine the elements to form the composite dielectric material. In another embodiment, particularly pertinent to the present invention, the composite dielectric material is formed by implantation of the metal to the vicinity of silicon dioxide, or by deposition of a layer of the metal followed by diffusion of the metal to the vicinity of silicon dioxide, after which the metal is caused to react with the silicon dioxide by a thermal treatment. As described in more detail below, in one embodiment, the metal undergoes an oxidation-reduction reaction with silicon dioxide to form a metal oxide, and then the metal oxide reacts with additional silicon dioxide to form a silicate, which is a composite dielectric material.

As used herein, the term "polysilicon-germanium" refers to a mixture of polysilicon and germanium, in which the germanium content varies from slightly more than zero up to about 60% by weight by the mixture. Thus, the amount of germanium may range from a doping amount up to about 60% by weight, of the mixture. The polysilicon-germanium may be formed by any method known in the art, i.e., by doping polysilicon with germanium, or by co-deposition, for example.

Using a high-K dielectric material for, e.g., a gate dielectric layer provides a low electrical thickness to be achieved while retaining a physically thick layer. For example, a high-K dielectric material layer with a K of 40 and a thickness of 100 angstroms (Å) is substantially electrically equivalent to a silicon dioxide layer (K about 4) having a thickness of about 10 Å. The electrically equivalent thickness of a high-K dielectric material layer may be referred to in terms of the equivalent oxide thickness of a layer of silicon dioxide. Thus, a high-K dielectric material layer having a K of 40 and a given physical thickness has an equivalent oxide thickness which is approximately 1/10 the given physical thickness. For high-K dielectric materials, reliably thick dielectric material layers can be formed while maintaining equivalent oxide thickness values lower than are possible with unreliably thin silicon dioxide layers. In this way, the reliability problems associated with very thin dielectric layers may be avoided while transistor performance is increased.

Approximate K-values or, in some cases, a range of K-values, are shown below in Table 1 for several exemplary dielectric materials. It is understood that the present invention is not limited to the specific dielectric materials disclosed herein, but may include any appropriate standard-K, high-K and composite dielectric materials which are known and are compatible with the remaining elements of the semiconductor device with which the dielectric materials are to be used.

TABLE 1

| Dielectric Material | Approximate Dielectric Constant (K) (Relative Permittivity) |
|---|---|
| silicon dioxide | 4 |
| silicon nitride | 6–9 |
| silicon oxynitride | 4–8 |
| aluminum oxide | 10 |
| zirconium silicate | 12 |
| hafnium silicate | 15 |
| hafnium aluminate | 12–20 |
| lanthanum oxide, $La_2O_3$ | 20–30 |
| hafnium oxide, $HfO_2$ | 40 |
| zirconium oxide, $ZrO_2$ | 25 |
| cerium oxide, $CeO_2$ | 26 |
| bismuth silicon oxide, $Bi_4Si_2O_{12}$ | 35–75 |
| titanium dioxide, $TiO_2$ | 30 |
| tantalum oxide, $Ta_2O_5$ | 26 |
| tungsten oxide, $WO_3$ | 42 |
| yttrium oxide, $Y_2O_3$ | 20 |
| $LaAlO_3$ | 25 |
| BST ($Ba_{1-x}Sr_xTiO_3$) | ~20—200 |
| $PbTiO_3$ | ~20—200 |
| $BaTiO_3$ | ~20—200 |
| $SrTiO_3$ | ~20—200 |
| $PbZrO_3$ | ~20—200 |
| PST ($PbSc_xTa_{1-x}O_3$) | ~20—3000 |
| PZN ($PbZn_xNb_{1-x}O_3$) | ~200—5000 |
| PZT ($PbZr_xTi_{1-x}O_3$) | ~100—1000 |
| PMN ($PbMg_xNb_{1-x}O_3$) | ~200—5000 |

It is noted that the K-values, or relative permittivity, for both standard-K and high-K dielectric materials may vary to some degree depending on the exact nature of the dielectric material and on the process used to deposit the material. Thus, for example, differences in purity, crystallinity and stoichiometry, may give rise to variations in the exact K-value determined for any particular dielectric material.

As used herein, when a material is referred to by a specific chemical name or formula, the material may include non-stoichiometric variations of the stoichiometrically exact formula identified by the chemical name. For example, hafnium oxide, when stoichiometrically exact, has the chemical formula $HfO_2$. As used herein, the term "hafnium oxide" may include variants of stoichiometric $HfO_2$, which may be referred to as $Hf_xO_y$, in which either of x or y vary by a small amount. For example, in one embodiment, x may vary from about 0.75 to about 1.5, and y may vary from about 1.5 to about 3. In another embodiment, x may vary from about 0.9 to about 1.2, and y may vary from about 1.8 to about 2.2. Such variations from the exact stoichiometric formula fall within the definition of hafnium oxide. Similar variations from exact stoichiometry are included when the chemical formula for a compound is used. For example, again using hafnium oxide as an example, when the formula $HfO_2$ is used, $Hf_xO_y$, as defined above, is included within the meaning. Thus, in the present disclosure, exact stoichiometry is intended only when such is explicitly so stated. As will be understood by those of skill in the art, such variations may occur naturally, or may be sought and controlled by selection and control of the conditions under which materials are formed.

Here and in all numerical values in the specification and claims, the limits of the ranges and ratios may be combined.

The present invention is described hereinbelow in terms of a common semiconductor device, specifically, a metal oxide semiconductor field effect transistor (MOSFET) formed on a silicon substrate. An embodiment of the present invention in a MOSFET is shown in FIG. 1. The present invention is not limited to this illustrative embodiment, however, and may be applied to any semiconductor device in which a high-K dielectric material may be used adjacent to the silicon surface of a semiconductor substrate or adjacent to a silicon or polysilicon or polysilicon-germanium surface. For example, a polysilicon or polysilicon-germanium gate electrode in a FET, in a polysilicon or polysilicon-germanium floating gate electrode EEPROM flash memory device, in a two-bit flash memory device, such as the MIRROR-BIT™ flash memory device available from Advanced Micro Devices, Sunnyvale, Calif. In general, the invention is applicable to any device having a high-K dielectric material layer which is to be formed in contact with silicon or polysilicon or polysilicon-germanium, in which it is desired to avoid oxidation of the silicon, polysilicon or polysilicon-germanium by the high-K dielectric material or by processes carried out for depositing the high-K dielectric material. Thus, it is to be understood that the present invention is not limited to the specific illustrative embodiments described below.

In one embodiment, the present invention relates to a process of making the semiconductor device, in which the semiconductor device includes a semiconductor substrate, a polysilicon or polysilicon-germanium gate electrode and a layer comprising a high-K gate dielectric material separating the polysilicon or polysilicon-germanium gate electrode from the semiconductor device surface, in which some amount of unwanted silicon dioxide has formed at the interface between the high-K dielectric material and the silicon substrate. In one embodiment, the layer of silicon dioxide forms during deposition of the high-K dielectric material layer. In one embodiment, a layer of a metal is deposited on the layer comprising a high-K dielectric material prior to deposition of the polysilicon or polysilicon-germanium layer. The semiconductor substrate and the applied layers are subjected to conditions under which the metal diffuses through the layer comprising a high-K dielectric material to the interface, which brings the metal into the vicinity of, into contact with, or sufficiently close to the silicon dioxide that the metal and the silicon dioxide can react with each other. In another embodiment, the metal is implanted through the layer comprising a high-K dielectric material to the interface. In this embodiment, the implantation brings the metal into the vicinity of, into contact with, or sufficiently close to the silicon dioxide that the metal and the silicon dioxide can react with each other. With the metal near the silicon dioxide (either by diffusion or implantation), under appropriate thermal conditions described more fully below, the metal and the silicon dioxide undergo an oxidation-reduction reaction, in which the metal is oxidized and the silicon dioxide is reduced to zero valency silicon, $Si^0$. In one embodiment, the metal is one in which the metal oxide has a K value greater than silicon dioxide. In one embodiment, the metal preferentially forms an oxide or a silicate rather than a silicide. In one embodiment, the Gibbs free energy of the metal oxide is more negative than the Gibbs free energy of silicon dioxide. In one embodiment, the Gibbs free energy of the metal oxide is more negative than the Gibbs free energy of the metal silicide. Thus, the thermodynamics of the metal, the metal silicide and silicon dioxide favor oxidation of the metal, reduction of the silicon, and disfavors formation of a metal silicide. A metal silicide is not wanted because it is likely to be conductive as opposed to being dielectric.

In one embodiment, the present invention relates to a process of making the semiconductor device, in which the semiconductor device may include, for example, a semiconductor substrate, a polysilicon or polysilicon-germanium gate electrode and a high-K gate dielectric material layer separating the polysilicon or polysilicon-germanium gate electrode from the semiconductor device surface, in which the polysilicon or polysilicon-germanium gate electrode is deposited by any suitable process known in the art.

FIG. 1 is a schematic cross-sectional view of a MOSFET 100. The MOSFET 100 includes, for example, a p-doped silicon substrate 102, an n-doped source region 104, an n-doped drain region 106, a layer comprising a high-K gate dielectric material 108, a gate electrode 110, and a channel region 112. The layer comprising a high-K gate dielectric material 108 and the gate 110 form a gate stack. The gate stack includes sidewall spacers 114. At the interface between the layer comprising a high-K gate dielectric material 108 and the substrate 102, is a metal oxide layer 116. It should be understood that the metal oxide layer 116 is depicted in FIG. 1 for clarity purposes as having a thickness which is exaggerated relative to its actual thickness. The metal oxide layer 116 includes a metal oxide formed in accordance with the present invention.

Not shown in FIG. 1 are additional parts of a working semiconductor device, such as electrical conductors, inter-layer dielectric layer, contacts and other parts of the structure which would be included in a complete, working semiconductor device. These additional parts are not necessary to the present invention, and for simplicity and brevity are neither shown nor described, but could be easily added as will be understood by those of skill in the art.

In one embodiment, the semiconductor substrate is a bulk silicon substrate. In one embodiment, the semiconductor substrate is a silicon-on-insulator semiconductor substrate. In another embodiment, the semiconductor substrate is a p-doped silicon substrate. Suitable semiconductor substrates include, for example, bulk silicon semiconductor substrates, silicon-on-insulator (SOI) semiconductor substrates, silicon-on-sapphire (SOS) semiconductor substrates, and semiconductor substrates formed of other materials known in the art. The present invention is not limited to any particular type of semiconductor substrate.

The metal of the metal oxide layer 116 is a metal which meets the above described criteria, which can be summarized as follows. First, it is a metal capable of forming a metal oxide having a K value greater than silicon dioxide. Second, it is a metal capable of reducing silicon dioxide to zero valency silicon, and being itself oxidized to form the metal oxide. Third, it is a metal which preferentially undergoes the oxidation-reduction reaction with silicon dioxide, to form a metal oxide and silicon, rather than reaction with silicon to form a silicide.

The metal may be appropriately selected based on the foregoing general criteria, and with reference to the following.

The metal may be selected without undue experimentation by reference to the Gibbs free energy of formation of the relevant materials. The Gibbs free energy, $\Delta G$, of a material may be determined by the following formula:

$$\Delta G = \Delta H - T\Delta S$$

where $\Delta H$ is the change in enthalpy for the reaction of interest, $\Delta S$ is the change in entropy for the reaction of interest, and T is the absolute temperature in degrees Kelvin (° K). For any reaction to occur spontaneously at a particular temperature and pressure, the change in free energy, $\Delta G$, must be negative at the temperature and pressure. In the temperature range of interest in most semiconductor processes, i.e., about 300° K to about 1100° K, the values for $\Delta H$ and $\Delta S$ do not change significantly. Therefore, it is possible to use tabulated values of $\Delta H$ and $\Delta S$ to calculate $\Delta G$ at any temperature of interest.

The reaction of primary interest in the present invention is:

$$SiO_2 \rightarrow Si + O_2$$

$$M + O_2 \rightarrow MO_2$$

where M is a divalent metal, and the net reaction is:

$$SiO_2 + M^0 \rightarrow Si^0 + MO_2$$

To obtain $\Delta G$ for this reaction, $\Delta G$ may be calculated for each of the two oxides shown above, i.e., $\Delta G(SiO_2)$ and $\Delta G(MO_2)$, and one subtracted from the other. If the $\Delta G$ for the metal oxide, $\Delta G(MO_2)$ is more negative than the $\Delta G$ for the silicon dioxide, $\Delta G(SiO_2)$, then the metal will be expected to function as a reducing agent in the above reaction in accordance with the present invention. It is noted that, while a divalent metal is used in the above and following examples, this is only for illustrative purposes, is not limiting, and any valency metal may be used, as will be understood by those of skill in the art.

An additional criteria must be met by the metal. Under the selected thermal conditions, the metal M should preferentially form metal oxide, e.g., $MO_2$, or the metal silicate, e.g., $MSiO_4$, rather than the metal silicide, e.g., MSi. In making the determination of the metal's preference for oxide formation or silicide formation, a similar calculation of $\Delta G$ can be made for the reactions, at the appropriate temperatures:

$$M + O_2 \rightarrow MO_2$$

$$M + Si \rightarrow MSi$$

where MSi represents the silicide formed by reaction of Si and the metal M. Comparison of the $\Delta G$ values obtained provides an indication whether the metal M preferentially forms an oxide or a silicide.

Finally, in order to have usefulness in the present application, the K value of the metal oxide should be greater than that of silicon dioxide. This is a direct result of the problem to be solved, which is the reduction of the overall K value of the layer comprising a high-K dielectric material, and the concomitant reduction in the equivalent oxide thickness of the layer, due to the presence of silicon dioxide together with the high-K dielectric material in the gate dielectric layer at the interface between the high-K dielectric material layer and the silicon substrate on which the high-K dielectric material is deposited. Thus, in one embodiment, the metal oxide has a K value at least greater than about 4, which is the approximate K value of silicon dioxide. In one embodiment, the metal oxide has a K value approximately the same as that of the high-K dielectric material in the layer comprising a high-K dielectric material. In another embodiment, the metal oxide has a K value in the range from about 10 to about 200. In another embodiment, the metal oxide may have a K value of any of the high-K dielectric materials described herein.

The above overall Gibbs free energy equation, $\Delta G = \Delta H - T\Delta S$, may be plotted on a graph for a range of temperatures, for each metal, metal oxide, silicon and silicon dioxide, and the metal silicide for the metal of interest. If the plots intersect, the point of intersection gives the equilibrium temperature for all reactants and products. The equilibrium point will also change with the partial pressure of gaseous reactants and products. The plots against temperature for the standard state reaction can be sued to obtain an approximate temperature for the reduction of the silicon dioxide with the metal of interest, and for the possible reaction of the metal with silicon to form a silicide.

Details of the process of the present invention are set forth below. The specific examples provided herein are intended to explain the invention, but are not intended to limit the scope of the invention, which is defined by the attached claims.

Metal Layer Deposition Embodiment

The first, metal layer deposition, embodiment of the present invention is described with reference to FIGS. 2–6. The embodiment is sometimes referred to below as the "metal layer embodiment".

Figure 2:
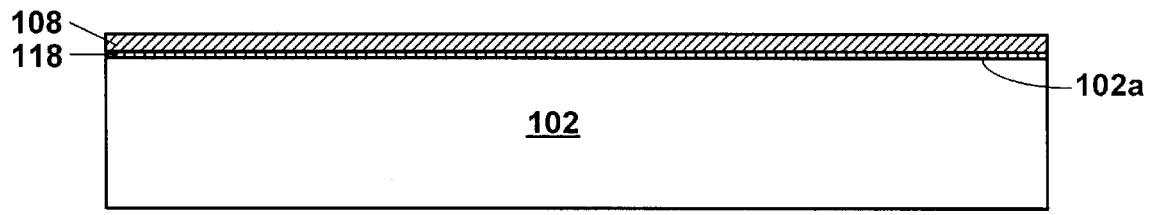
FIGS. 2–5B are schematic cross-sectional views of steps of fabricating a semiconductor substrate having a high-K dielectric material layer on a silicon substrate, in accordance with an embodiment of the present invention.
Figure 6:
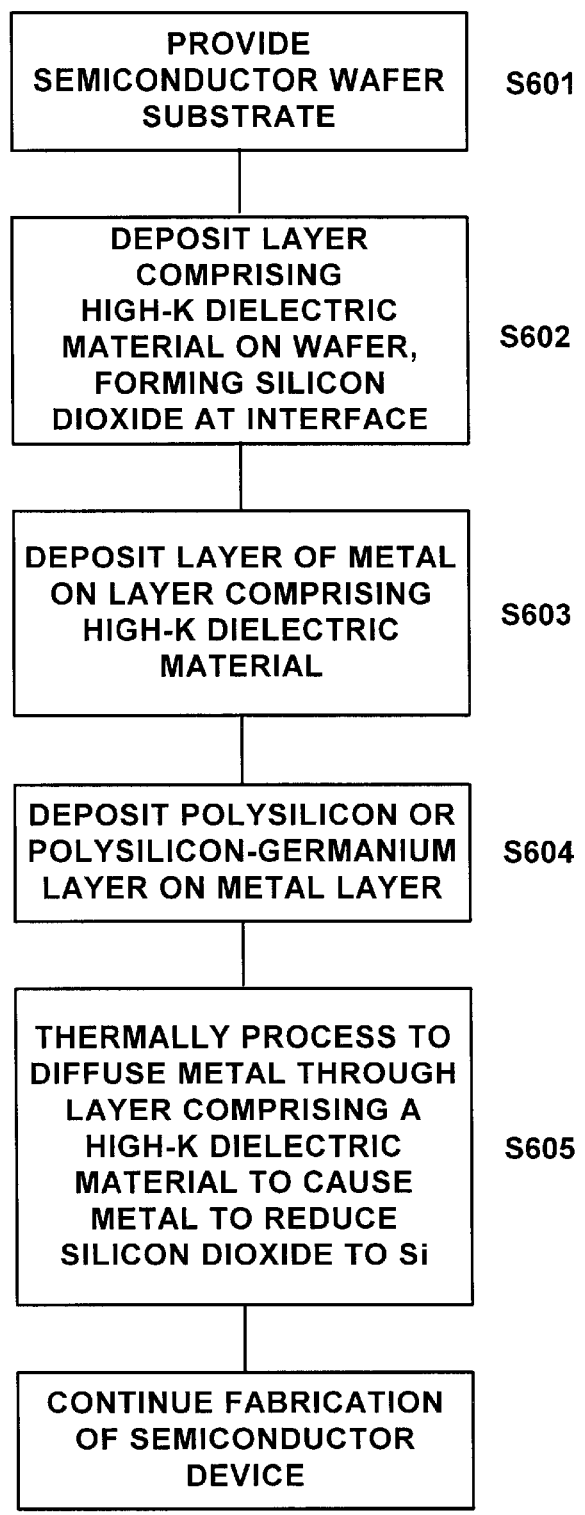
FIG. 6 is a schematic flow diagram showing basic steps in a process of fabricating a semiconductor device in accordance with one embodiment of the present invention.

In the first step of this embodiment, shown in FIG. 6 as Step S601, a semiconductor substrate 102 is provided, as shown in, e.g., FIG. 2. The semiconductor substrate may be any appropriately selected semiconductor substrate known in the art, as described above. In some embodiments, the semiconductor substrate 102 may be n- or p-doped. The semiconductor substrate 102 includes a surface 102a, shown in FIG. 2. In one embodiment, the semiconductor substrate 102 is silicon, and in another embodiment, the semiconductor substrate 102 is polysilicon or polysilicon-germanium.

In the second step of this embodiment, shown in FIG. 6 as Step S602, a layer comprising a high-K dielectric material 108 is deposited on the surface 102a. FIG. 2 shows an embodiment of the semiconductor substrate 102 after deposition of a layer comprising a high-K dielectric material 108 on the surface 102a. As shown in FIG. 2, when the layer comprising a high-K dielectric material 108 is deposited on the substrate 102, an unwanted interfacial silicon dioxide layer 118 also is formed by oxidation of the silicon surface 102a. The silicon dioxide is an unwanted by-product of the deposition of the high-K dielectric material layer 108. Formation of the interfacial silicon dioxide layer 118 is detrimental because silicon dioxide has a K value of about 4, and thereby reduces the equivalent oxide thickness of the gate dielectric, which is intended to be formed of the high-K dielectric material, which has a K value of at least about 10, as defined above. The presence of the interfacial silicon dioxide reduces the effective K value of the gate dielectric, and thereby reduces the equivalent oxide thickness. The present invention provides a method for eliminating this detriment.

In one embodiment, prior to depositing the high-K dielectric material layer 108, the surface 102a is cleaned to remove any contaminants and to remove any native oxides or any other passivating material (such as hydrogen) which may have been formed thereon. Suitable methods for such cleaning and removal are known in the art.

In one embodiment, the high-K dielectric material layer 108 may be deposited by ALCVD, RTCVD or MOCVD. In other embodiments the high-K dielectric material layer 108 may be deposited by any method capable of depositing a uniform layer of the high-K dielectric material layer 108. Other CVD or physical deposition processes may be used.

The high-K dielectric material layer 108 is deposited, in one embodiment, to a thickness in the range from about 20 angstrom (Å) to about 200 Å. In another embodiment, the thickness of the high-K dielectric material layer 108 is in the range from about 30 Å to about 100 Å. In another embodiment, the high-K dielectric material layer 108 is deposited to a thickness of about 50 Å.

In one embodiment, the high-K dielectric material includes at least one of $ZrO_2$, $HfO_2$, $Al_2O_3$, $Y_2O_3$, $La_2O_3$, silicates of one or more of $ZrO_2$, $HfO_2$, $Al_2O_3$, $Y_2O_3$, $La_2O_3$, or aluminates of one or more of $ZrO_2$, $HfO_2$, $Y_2O_3$, $La_2O_3$. In another embodiment, the high-K dielectric material includes at least one of hafnium oxide ($HfO_2$), zirconium oxide ($ZrO_2$), tantalum oxide ($Ta_2O_5$), barium titanate ($BaTiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), strontium titanate ($SrTiO_3$), lead zirconate ($PbZrO_3$), tungsten oxide ($WO_3$), yttrium oxide ($Y_2O_3$), barium strontium oxide ($Ba_{1-x}Sr_xO_3$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$). In addition to the foregoing high-K dielectrics, other high-K dielectric materials, for example, ferroelectric high-K dielectric materials such as lead lanthanum titanate, strontium bismuth tantalate, bismuth titanate and barium zirconium titanate may be suitably used in the present invention. Other high-K dielectric materials known in the art, including, for example binary and ternary oxides having K values of about 10 or higher, also may be used in the present invention.

In one embodiment, the high-K dielectric material is implanted with atoms which inhibit recrystallization of the high-K dielectric material. It is preferred that the high-K dielectric material remain amorphous, rather than crystalline. A method of inhibiting the recrystallization of high-K dielectric materials by implantation of one or more dopant species such as nitrogen, silicon, germanium, aluminum or the like has been discovered and is disclosed in copending, commonly assigned U.S. application Ser. No. 10/146.232, filed May 15, 2002 entitled RECRYSTALLIZATION INHIBITION BY DOPANT IMPLANTATION. The disclosure of this application is incorporated by reference herein for its teachings relating to implantation of one or more dopant species, for inhibiting recrystallization of the high-K dielectric material.

In one embodiment, the high-K dielectric material is a high-K dielectric material other than tantalum oxide ($Ta_2O_5$). Tantalum oxide has been found, in some embodiments, to exhibit an undesirably high leakage current.

In one embodiment, the high-K dielectric material has a K value in the range from about 10 to about 5000. In another embodiment, the high-K dielectric material has a K value in the range from about 10 to about 500, and in yet another embodiment, the K value is from about 20 to about 50.

The thickness of the interfacial silicon dioxide layer 118 varies from a broken, incomplete monolayer to a layer which is a few angstroms thick. Since this layer 118 is an unwanted layer, in one embodiment, the process by which it is formed is adjusted to minimize its formation. However, in any process, the thickness of the interfacial silicon dioxide layer 118 may be in the range from a single molecule, i.e., a monolayer thick, up to about 10 Å, or more. The thickness may be any thickness, and is not limiting to the scope of the invention.

Figure 3:
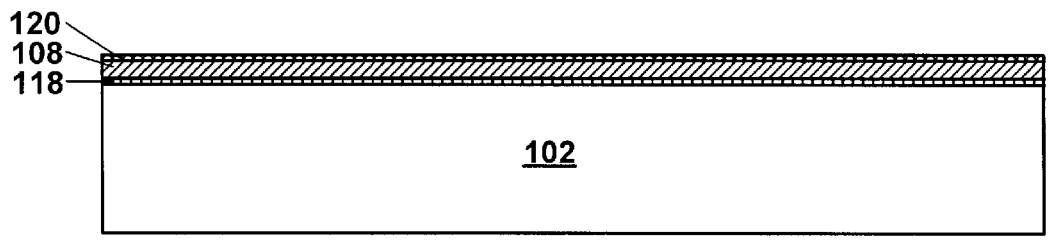

In the third step of the metal layer embodiment, shown in FIG. 6 as Step S603, a metal layer 120 is deposited on the surface of the high-K dielectric material layer 108. FIG. 3 shows an embodiment of the semiconductor substrate 102 after deposition of the metal layer 120 on the surface of the high-K dielectric material layer 108.

The metal layer 120 may be deposited on the high-K dielectric material layer 108 by any appropriate method known in the art. In one embodiment, the metal layer 120 may be deposited by LPCVD, RTCVD, MOCVD or ALCVD. In other embodiments, the metal layer 120 may be deposited by PVD, sputtering, chemical solution deposition (CSD), molecular beam epitaxy (MBE) or evaporation.

The metal layer 120 may comprise an appropriate metal selected based on the criteria discussed above. The metal selected will form the metal oxide 116 subsequently. In one embodiment, the metal may be titanium, tantalum, calcium, aluminum, hafnium, zirconium, vanadium, tungsten, yttrium or mixtures thereof. In one embodiment, the metal is one which forms an oxide having a K value as defined above for high-K dielectric materials. Thus, in one embodiment, the metal may be hafnium, zirconium, titanium, tantalum, or yttrium. In another embodiment, the metal is one which forms a silicate, by reaction with silicon dioxide following the oxidation-reduction reaction, which has a K value as defined above for composite dielectric materials. For example, hafnium oxide, $HfO_2$, may react with silicon dioxide, $SiO_2$ to form hafnium silicate, $HfSiO_4$, a composite dielectric material as defined above.

Figure 4A:
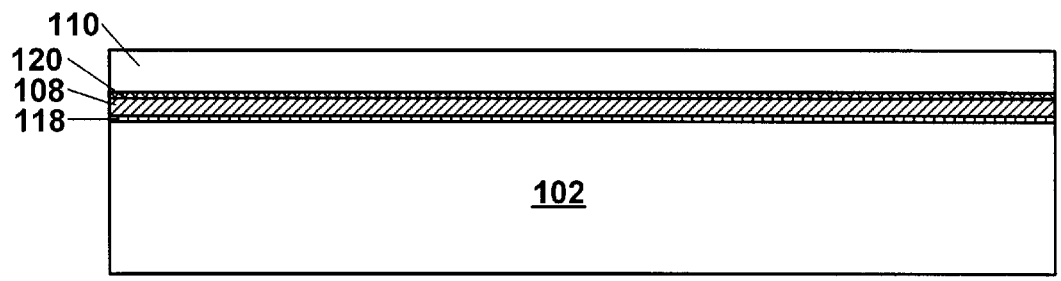

In the fourth step of the metal layer embodiment, shown in FIG. 6 as Step S604, a polysilicon or polysilicon-germanium gate layer 110 is deposited on the metal layer 120, as shown in FIG. 4A. After further processing, the polysilicon or polysilicon-germanium gate layer 110 may form, e.g., a gate electrode in, e.g., a FET, or it may be a control gate or a floating gate in a flash memory device.

The polysilicon or polysilicon-germanium gate layer 110 may be deposited on the surface of the metal layer 120 by any suitable method known in the art. In one embodiment the step of depositing the polysilicon or polysilicon-germanium gate layer 110 is carried out by LPCVD, RTCVD, MOCVD or ALCVD. In one embodiment, the step of depositing a polysilicon or polysilicon-germanium gate layer 110 is carried out by a plasma CVD process, i.e., PECVD. In one embodiment, the polysilicon or polysilicon-germanium gate layer 110 is deposited by LPCVD.

FIG. 4A shows an embodiment of the semiconductor substrate 102 after deposition of a polysilicon or polysilicon-germanium gate layer 110 on the metal layer 120.

Either before or after the below-described thermal processing, the gate layer 110 and the high-K dielectric layer 108 are etched to form a gate stack, and further processed to form the sidewall spacers 114. The formation of the gate stack and the sidewall spacers 114 may be carried out by any means appropriate and known in the art. The time at which the etching to form the gate stack is carried out may be appropriately selected as needed by the skilled artisan.

Figure 4B:
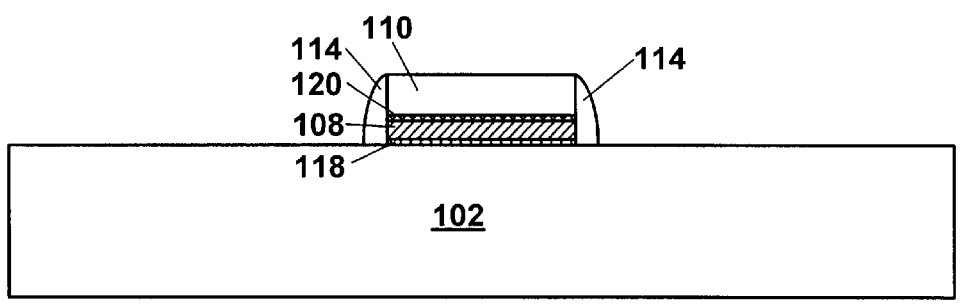

In one embodiment, the structure shown in FIG. 4A is further processed by appropriate steps, including etching to form a gate stack and deposition of material for the sidewall spacers 114, as shown in FIG. 4B. In this embodiment, the gate stack is formed prior to the thermal processing by which the metal is diffused through the high-K dielectric material layer 108. In this embodiment, the high-K dielectric layer 108 and the upper surface 102a of the substrate 102 are protected from any further contamination by oxygen, as a result of the gate layer 110 and the sidewall spacers 114 forming a barrier between the high-K dielectric material and the external environment.

Figure 5A:
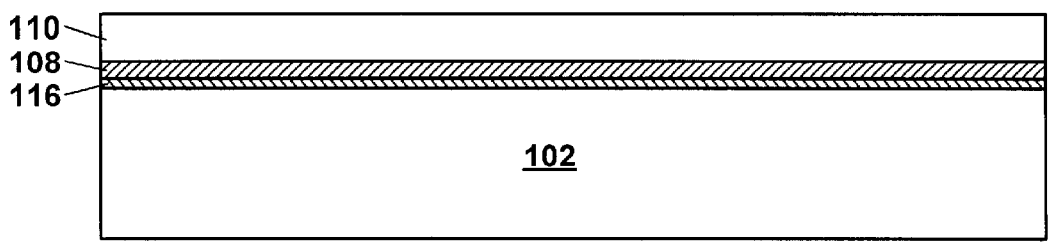

In another embodiment, the structure shown in FIG. 4A is first subjected to the below-described thermal processing to form a structure such as that shown in FIG. 5A. The structure shown in FIG. 5A is then processed by appropriate steps, including etching to form a gate stack and deposition of material to form the sidewall spacers 114, resulting in formation of the structure shown in FIG. 5B.

Figure 5B:
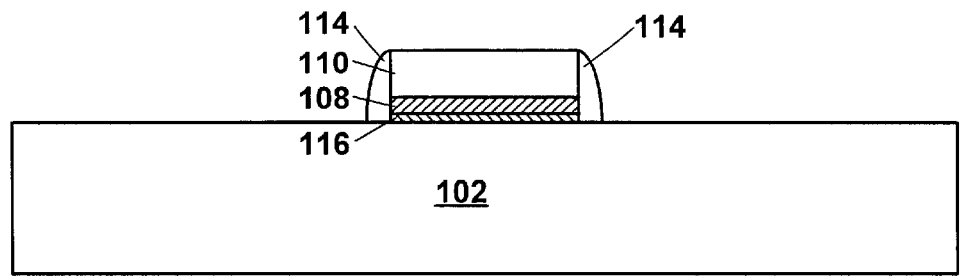

Thus, whether the gate stack is formed first, followed by thermal processing, or thermal processing is carried out first, followed by formation of the gate stack, the structure shown in FIG. 4A is transformed into the structure shown in FIG. 5B, as a result of the fourth and fifth steps of the present invention. The fifth step is described as follows.

In the fifth step of the metal layer embodiment, shown in FIG. 6 as Step S605, the nascent semiconductor device 100, including the semiconductor substrate 102 and the layers which have been deposited thereon, is subjected to thermal processing. As a result of the thermal processing, the metal layer 118 diffuses through the high-K dielectric material layer 108 to reach the vicinity of the interfacial silicon dioxide layer 118. At an appropriate temperature, the metal, M, reacts with the silicon dioxide, $SiO_2$, in an oxidation-reduction reaction, whereby the metal is oxidized to $MO_x$, where x is a number appropriate to the valency of the metal M, and the $SiO_2$ is reduced to silicon of zero valence, i.e., $Si^0$. This reaction is discussed in more detail above. This step in essence converts the silicon dioxide layer 118 to the metal oxide layer 116, as shown in FIGS. 1, 5A and 5B. The metal oxide layer 116 contains some amount of silicon, as will be recognized. As noted above, the metal oxide has a K value greater than that of silicon dioxide.

In the metal layer embodiment, the thermal processing is similar to a thermal annealing process. The thermal conditioning is carried out for a time sufficient to diffuse the metal through the high-K dielectric material layer 108, and to cause the metal to react with the silicon dioxide as described above. The temperature of the thermal conditioning is in the range from about 300° C. to about 1100° C. In one embodiment, the temperature is in the range from about 500° C. to about 1000° C., and in another embodiment, from about 600° C. to about 900° C.

In the metal layer embodiment, the time of thermal processing is in the range from about 1 minute to about 120 minutes. In one embodiment, the time is in the range from about 15 minutes to about 60 minutes.

The thermal processing is carried out in a suitable chamber under an atmosphere which will not result in reversal of the oxidation-reduction reaction. As noted above in the discussion of Gibbs free energies, the equilibrium position of the reaction depends on the partial pressure of oxygen. Thus, in one embodiment, the thermal processing is carried out in an inert atmosphere. The inert atmosphere may include one or more of nitrogen or one of the noble gases, e.g., argon, neon or xenon. In another embodiment, the thermal processing is carried out in a relatively inert atmosphere. By relatively inert is meant an atmosphere that may contain a quantity of oxygen, but which is substantially non-oxidizing and which does not affect the equilibrium position of the metal-silicon dioxide oxidation-reduction reaction.

As a result of the process of this embodiment, the unwanted interfacial silicon dioxide layer 118 has been converted into a metal oxide having a higher K value than the silicon dioxide, while the silicon dioxide has been reduced to silicon.

Metal Implantation Embodiment

Figure 9:
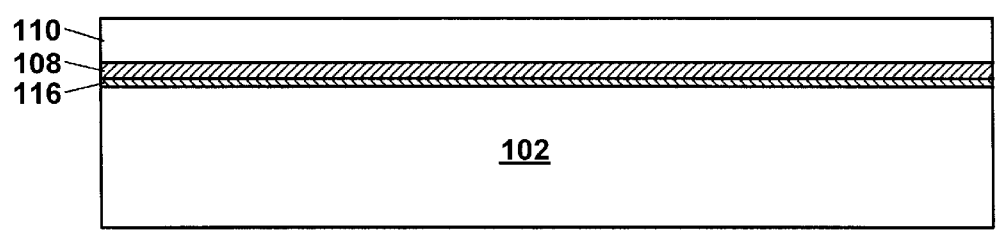
Figure 10:
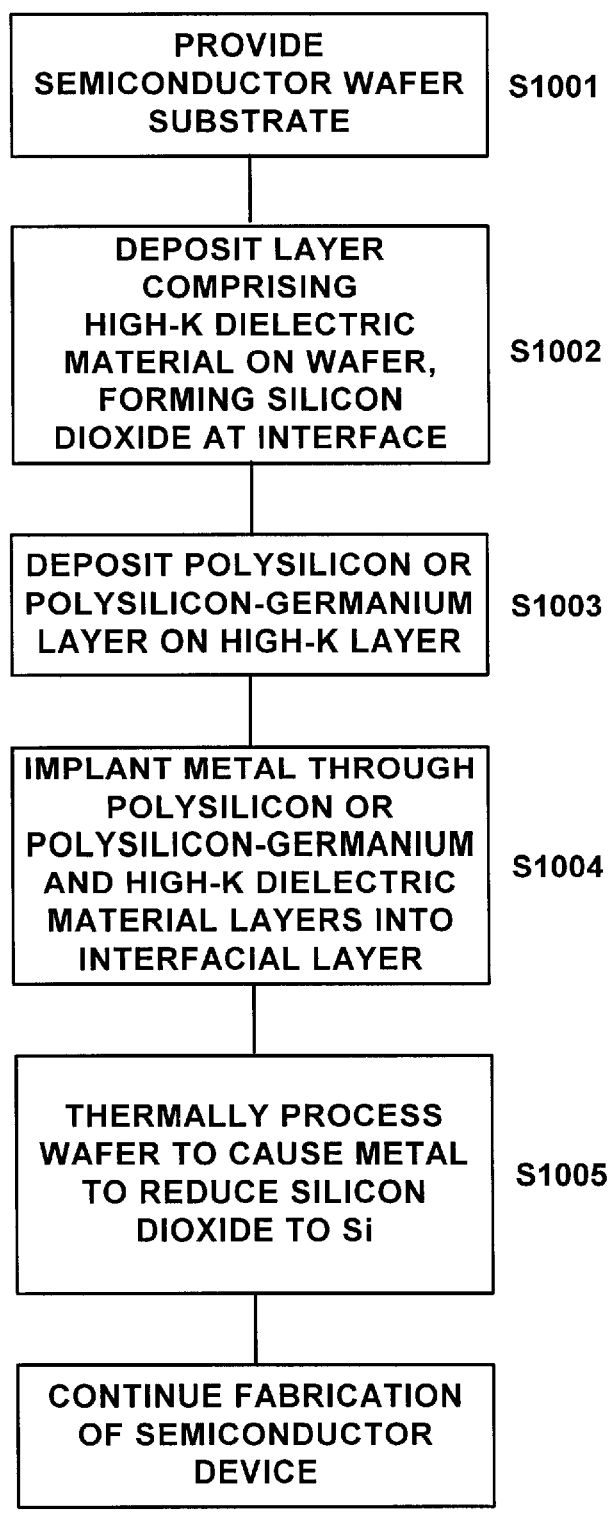
FIG. 10 is a schematic flow diagram showing basic steps in a process of fabricating a semiconductor device in accordance with another embodiment of the present invention.

In a second embodiment of the present invention, the metal which is provided to react with the silicon dioxide is provided to the nascent semiconductor device 100 by implantation. This embodiment is sometimes referred to as the "implantation embodiment". This embodiment is described with reference to FIGS. 2 and 7–10. FIG. 10 is a schematic flow diagram showing basic steps in an implantation process, in accordance with another embodiment of the present invention.

In the first step of this embodiment, shown in FIG. 10 as Step S1001, a semiconductor substrate 102 is provided, as shown in, e.g., FIG. 2. This step is substantially the same as Step S601, described above. The semiconductor substrate may be any appropriately selected semiconductor substrate known in the art, as described above with respect to the metal layer embodiment. In one embodiment, the semiconductor substrate 102 is silicon, and in another embodiment, the semiconductor substrate 102 is polysilicon or polysilicon-germanium.

In the second step of this embodiment, shown in FIG. 10 as Step S1002, a layer comprising a high-K dielectric material 108 is deposited on the surface 102a. This step is substantially the same as Step S602, described above. FIG. 2 shows an embodiment of the semiconductor substrate 102 after deposition of a layer comprising a high-K dielectric material 108 on the surface 102a. Deposition of the high-K dielectric material layer 108 results in the formation of an unwanted interfacial silicon dioxide layer 118, as described above. This layer 118 has the same detrimental effects in this embodiment as described above. The methods and materials used for deposition of the high-K dielectric material layer are the same as described above with respect to the metal layer embodiment, so the description thereof is not repeated here, for the sake of brevity.

Figure 7:
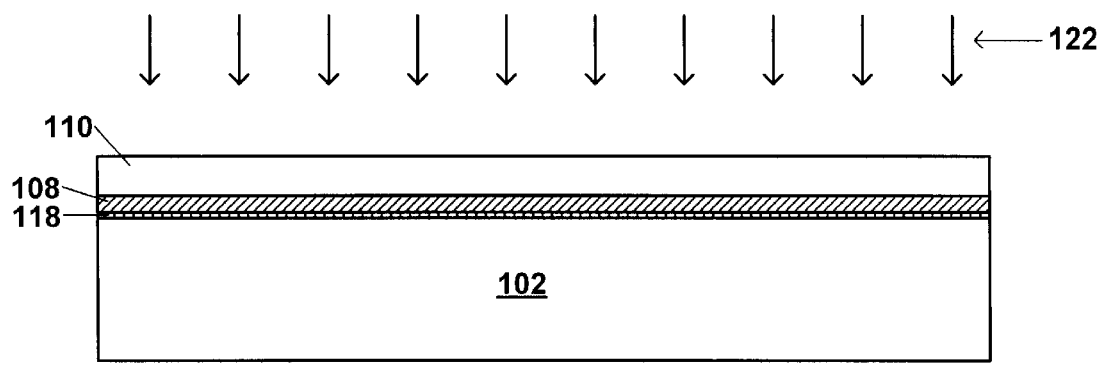
FIGS. 7–9 are schematic cross-sectional views of steps of fabricating a semiconductor substrate having a high-K dielectric material layer on a silicon substrate, in accordance with another embodiment of the present invention.

In the third step of the implantation embodiment, shown in FIG. 10 as Step S1003, a polysilicon or polysilicon-germanium gate layer 110 is deposited on the layer 108, to form a semiconductor structure such as shown in FIG. 7. This step is substantially the same as Step S604, described above. After further processing, the polysilicon or polysilicon-germanium gate layer 110 may form, e.g., a gate electrode in, e.g., a FET, or it may be a control gate or a floating gate in a flash memory device. The polysilicon or polysilicon-germanium gate layer 110 may be deposited on the surface of the metal layer 120 by any suitable method known in the art, as described above with respect to Step S604 in the metal layer embodiment. Further description is omitted here for the sake of brevity.

In the fourth step of the implantation embodiment, shown in FIG. 10 as Step S1004, a metal is implanted into the nascent semiconductor device 100, as shown in FIG. 7. FIG. 7 schematically shows implantation of the metal by arrows 122 directed to the upper surface of the polysilicon or polysilicon-germanium layer 110. The arrows 122 represent schematically the metal which is being implanted into the semiconductor substrate 102. The metal is implanted through the polysilicon or polysilicon layer 110, and through the high-K dielectric material layer 108, to the interface between the layer 108 and the underlying semiconductor substrate 102. As described above, at the interface there is an unwanted interfacial silicon dioxide layer 118.

The metal which is implanted may be any of the metals mentioned above with respect to the metal layer embodiment. Thus, in one embodiment, the metal may be titanium, tantalum, calcium, aluminum, hafnium, zirconium, vanadium, tungsten, yttrium or mixtures thereof.

The metal is implanted at an appropriate energy to reach the interfacial silicon dioxide layer 118. Persons of skill in the art can determine appropriate energies of implantation based on factors such as the identity of the metal, the identity, thickness and crystallinity of the polysilicon or polysilicon-germanium layer 110, and the identity, thickness and crystallinity of the high-K dielectric material layer 108. An appropriate dosage may be determined based on the estimated quantity of silicon dioxide in the interfacial silicon dioxide layer 118.

Figure 8:
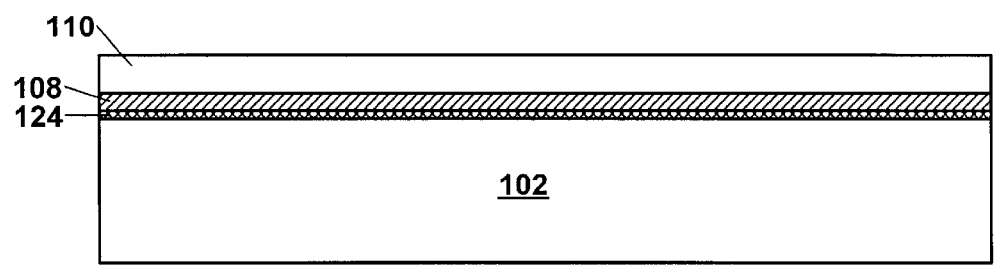

When the metal has been implanted, the structure shown in FIG. 8 is obtained. This structure includes a mixed layer 124 which comprises both the silicon dioxide and the implanted metal. The mixed layer 124 will subsequently be converted to a metal oxide layer by thermal processing.

It is recognized that some damage to the polysilicon or polysilicon-germanium layer and to the high-K dielectric material layer may occur as a result of the implantation of the metal. Such damage, particularly to the polysilicon or polysilicon-germanium layer, may be at least partially mitigated by the subsequent thermal processing. In addition, since it is desirable for the high-K dielectric material layer 108 to be amorphous, rather than crystalline, to the extent the layer 108 includes crystallinity, it may be advantageous to damage the crystals, thereby reducing the size and crystallinity of the crystals.

In the fifth step of the implantation embodiment, shown in FIG. 10 as Step S1005, the nascent semiconductor device 100, including the semiconductor substrate 102, the layers 108 and 110 which have been deposited thereon, and the mixed layer 124, is subjected to thermal processing. This step is substantially the same as Step S605, described above with respect to the metal layer embodiment, except as noted.

In this embodiment, the thermal processing results in the metal in the mixed layer 124 reacting with the silicon dioxide in the mixed layer 124. The reaction between the metal and the silicon dioxide forms zero valency silicon and the metal oxide. This series of steps, including implantation and thermal processing, in effect converts the silicon dioxide layer 118 to the metal oxide layer 116, as shown in FIGS. 1, and 9. The metal oxide layer 116 contains some amount of silicon, as will be recognized. As noted above, the metal oxide has a K value greater than that of silicon dioxide.

In the implantation embodiment, the thermal processing is carried out as described above with respect to Step S605 in the metal layer embodiment, except that the time required is less in the present embodiment, due the fact that the metal is already present in the mixed layer 124, and does not have to be diffused through the high-K dielectric material layer 108 as in the metal layer embodiment. Thus, the temperature of the thermal conditioning is in the range from about 300° C. to about 1100° C. In one embodiment, the temperature is in the range from about 500° C. to about 1000° C., and in another embodiment, from about 600° C. to about 900° C.

In the implantation embodiment, the time of thermal processing is in the range from about 1 minute to about 60 minutes. In one embodiment, the time is in the range from about 5 minutes to about 30 minutes.

The thermal processing is carried out in a suitable chamber under an atmosphere which will not result in reversal of the oxidation-reduction reaction, substantially as described above with respect to the metal layer embodiment, so for brevity is not repeated.

As a result of the process of the implantation embodiment, the unwanted interfacial silicon dioxide layer 118 has been converted into a metal oxide having a higher K value than the silicon dioxide, while the silicon dioxide has been reduced to silicon.

In the present invention, in both the metal layer embodiment and the implantation embodiment, the above-described thermal processing may be carried out as a separate, discrete step, or it may be incidental to some other processing step which includes subjecting the wafer to an elevated temperature for an appropriate period of time. The scope of the invention is not restricted to either of these, as long as the wafer described herein is subjected to a step of thermal processing at an appropriate time after the metal has been provided to the wafer.

It is noted that in the implantation embodiment, as in the metal layer embodiment, the etching steps to form the gate stack, and the deposition steps to form the sidewall spacers 114 may be carried out either prior to or subsequent to the thermal processing step. While these alternate pathways are not described in detail, the pathways are similar and correspond to those described above with respect to the metal layer embodiment.

Upon completion of the thermal processing of both the metal layer embodiment and the implantation embodiment, the nascent semiconductor device 100 may be further processed, including formation of the source and drain 104, 106, by which the semiconductor device 100 shown in FIG. 1 is obtained. The source and drain 104, 106 may be formed at an appropriate time in the process, such as by a self-aligned implantation method. Thereafter, the semiconductor device 100 may be further processed as appropriate to the fabrication scheme of which the process of the present invention is a part, as shown in the final step of FIG. 6.

INDUSTRIAL APPLICABILITY

According to the present invention, a high-K dielectric material layer may be deposited on a silicon, polysilicon or polysilicon-germanium semiconductor substrate, without the reduction of the K value of the high-K dielectric material layer which would result from the presence of unwanted interfacial silicon dioxide at the interface between the high-K layer and the semiconductor substrate. Thus, these layers may be fabricated without the undesirable reduction in equivalent oxide thickness of the dielectric layer which may result from a quantity of silicon dioxide at such an interface. The present invention helps to avoid leakage currents and other problems which may occur when a high-K dielectric material is formed directly on a silicon substrate, by conventional methods. This invention does not require the formation of an interfacial barrier layer, but still avoids a significant loss of the K-value of the high-K dielectric material which might result from the presence of silicon dioxide at the interface.

While the invention has been described in conjunction with specific embodiments herein, it is evident that many alternatives, modifications and variations will be apparent to those skilled in the art in light of the foregoing description. Accordingly it is intended to embrace all such alternatives and modifications in variations as for within the spirit and broad scope of the appended claims.

What is claimed is:

1. A process for fabricating a semiconductor device having a high-K dielectric layer over a silicon substrate, comprising:
depositing on the silicon substrate a layer comprising at least one high-K dielectric material, whereby a quantity of silicon dioxide is formed at an interface between the silicon substrate and the high-K dielectric material layer;
depositing on the high-K dielectric material layer a layer of a metal; and
diffusing the metal through the high-K dielectric material layer, whereby the metal reduces at least a portion of the silicon dioxide to silicon and the metal is oxidized to form a dielectric material having a K value greater than silicon dioxide.

2. The process of claim 1, wherein the metal preferentially forms an oxide or a silicate rather than a silicide.

3. The process of claim 1, wherein the high-K dielectric material is deposited by ALCVD, RTCVD or MOCVD.

4. The process of claim 1, wherein the high-K dielectric material comprises at least one of hafnium oxide ($HfO_2$), zirconium oxide ($ZrO_2$), tantalum oxide ($Ta_2O_5$), barium titanate ($BaTiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), silicon titanate ($SiTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$).

5. The process of claim 1, wherein the metal comprises titanium, tantalum, calcium, aluminum, hafnium, zirconium, vanadium tungsten, yttrium or mixtures thereof.

6. The process of claim 1, further comprising depositing a polysilicon or polysilicon-germanium layer over the metal layer.

7. A process for fabricating a semiconductor device having a high-K dielectric layer over a silicon substrate, comprising:
depositing on the silicon substrate a layer comprising at least one high-K dielectric material, whereby a quantity of silicon dioxide is formed at an interface between the silicon substrate and the high-K dielectric material layer;
implanting a metal to a vicinity of the silicon dioxide; and
subjecting the metal to conditions whereby the metal reduces at least a portion of the silicon dioxide to silicon and the metal is oxidized to form a dielectric material having a K value greater than silicon dioxide.

8. The process of claim 7, wherein the metal preferentially forms an oxide or a silicate rather than a silicide.

9. The process of claim 7, wherein the high-K dielectric material is deposited by ALCVD, RTCVD or MOCVD.

10. The process of claim 7, wherein the high-K dielectric material comprises at least one of hafnium oxide ($HfO_2$), zirconium oxide ($ZrO_2$), tantalum oxide ($Ta_2O_5$), barium titanate ($BaTiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), silicon titanate ($SiTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$).

11. The process of claim 7, wherein the metal comprises titanium, tantalum, calcium, aluminum, hafnium, zirconium, vanadium, tungsten, yttrium or mixtures thereof.

12. The process of claim 7, further comprising depositing a polysilicon or polysilicon-germanium layer over the high-K dielectric material layer.

13. A process for fabricating a semiconductor device having a high-K dielectric layer over a silicon substrate, comprising:
depositing on the silicon substrate a layer comprising at least one high-K dielectric material, whereby a quantity of silicon dioxide is formed at an interface between the silicon substrate and the high-K dielectric material layer;
providing a metal at the interface; and subjecting the semiconductor device to conditions whereby the metal reduces at least a portion of the silicon dioxide to silicon and the metal is oxidized to form a dielectric material having a K value greater than silicon dioxide.

14. The process of claim 13, wherein the metal preferentially forms an oxide or a silicate rather than a silicide.

15. The process of claim 13, wherein the high-K dielectric material is deposited by ALCVD, RTCVD or MOCVD.

16. The process of claim 13, wherein the high-K dielectric material comprises at least one of hafnium oxide ($HfO_2$), zirconium oxide ($ZrO_2$), tantalum oxide ($Ta_2O_5$), barium titanate ($BaTiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), silicon titanate ($SiTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$).

17. The process of claim 13, wherein the metal comprises titanium, tantalum, calcium, aluminum, hafnium, zirconium, vanadium, tungsten, yttrium or mixtures thereof.

18. The process of claim 13, wherein the metal is provided by deposition of a layer of the metal over the high-K dielectric material layer, followed by diffusing the metal through the high-K dielectric material layer to a vicinity of the silicon dioxide formed at the interface.

19. The process of claim 13, wherein the metal is provided by implantation of the metal to a vicinity of the silicon dioxide formed at the interface.

20. The process of claim 13, further comprising depositing a polysilicon or polysilicon-germanium layer over the high-K dielectric material layer.

* * * * *